United States Patent
Van Cleemput

[11] Patent Number: 6,149,779
[45] Date of Patent: *Nov. 21, 2000

[54] LOW-K BSG GAP FILL PROCESS USING HDP

[75] Inventor: Patrick A. Van Cleemput, Sunnyvale, Calif.

[73] Assignee: Novellus Systems, Inc., San Jose, Calif.

[ * ] Notice: This patent is subject to a terminal disclaimer.

[21] Appl. No.: 09/185,164

[22] Filed: Nov. 3, 1998

[51] Int. Cl.[7] ...................................................... C23L 14/34
[52] U.S. Cl. .................. 204/192.37; 204/192.12; 427/569; 427/585; 427/590; 438/513; 438/778
[58] Field of Search ................... 204/192.12, 192.32, 204/192.35, 192.37; 427/569, 585, 590; 438/513, 778

[56] References Cited

U.S. PATENT DOCUMENTS

| | | | |
|---|---|---|---|
| 5,100,505 | 3/1992 | Cathy, Jr. ................................ | 156/643 |
| 5,133,986 | 7/1992 | Blum et al. ............................... | 427/39 |
| 5,776,834 | 7/1998 | Avanzino et al. ....................... | 438/692 |
| 5,817,562 | 10/1998 | Chang et al. ........................... | 438/305 |
| 5,913,140 | 6/1999 | Roche et al. ............................ | 438/624 |
| 6,030,881 | 2/2000 | Papasouliotis et al. ................ | 438/424 |

OTHER PUBLICATIONS

JP 2–285066 abstract, Nov. 1990.

*Primary Examiner*—Nam Nguyen
*Assistant Examiner*—Steven H. VerSteeg
*Attorney, Agent, or Firm*—Skjerven Morrill MacPherson LLP; Tom Chen

[57] ABSTRACT

A low dielectric constant gap-fill process using high density plasma (HDP) deposition is provided for depositing a boron-doped silicon oxide layer to eliminate the damaging effects of fluorine on underlying circuitry while still maintaining a low dielectric constant for an intermetal dielectric (IMD) layer.

13 Claims, 1 Drawing Sheet

LOW-K BSG GAP FILL PROCESS USING HDP

FIELD OF THE INVENTION

The present invention relates generally to methods of thin film deposition and, more particularly, to a process of depositing low dielectric constant (k), intermetal dielectric (IMD) layers using high density plasma (HDP) chemical vapor deposition (CVD).

DESCRIPTION OF RELATED ART

Integrated circuits fabricated on semiconductor substrates for large scale integration require multiple levels of metal interconnections to electrically interconnect the discrete layers of semiconductor devices on the semiconductor chips. The different levels of interconnections are separated by various insulating or dielectric layers, which have etched via holes to connect one level of metal to the next. Typically, the insulating layer is a silicon oxide having a dielectric constant k of approximately 4.1 to approximately 4.5.

However, as semiconductor technology advances, circuit elements and dimensions on wafers or silicon substrates are becoming increasingly more dense. Consequently, the spacing between the metal lines in the interconnections needs to be reduced to effectively connect the various circuit elements. By decreasing the thickness of the insulating layers, intralevel and interlevel capacitances between the metal lines increase since the capacitance is inversely proportional to the spacing between the lines. As capacitance increases, the RC time delay increases, which decreases the frequency response of the circuit and increases the signal propagation time through the circuit, thereby adversely affecting circuit performance. Therefore, it is desirable to minimize the RC time constant. One approach to reduce these RC time delays is to use an insulating material having a lower dielectric constant k to reduce the capacitance between the metal lines. Low k layers also help to prevent cross-talk between different metal layers and reduce device power consumption.

One method to reduce the dielectric constant is to incorporate fluorine or other halogen elements such as chlorine or bromine into the silicon oxide layer. Fluorine-doped silicon oxide layers or films are commonly referred to as fluorosilicate glass (FSG) films. Using FSG films can typically reduce the dielectric constant down to about 3.5.

In addition to decreasing the dielectric constant, incorporating fluorine in silicon oxide layers also helps solve common problems encountered in fabricating smaller geometry devices with increasingly more dense circuit elements. In order to prevent unwanted interactions between these circuit elements, insulator-filled gaps or trenches located therebetween are provided to physically and electrically isolate the elements and conductive lines. However, as circuit densities continue to increase, the widths of these gaps decrease further, thereby increasing gap aspect ratios, typically defined as the gap height divided by the gap width. As a result, filling these narrower gaps becomes more difficult, which can lead to unwanted voids and discontinuities in the insulating or gap-fill material.

Currently, high density plasma (HDP) oxide deposition is used to fill high aspect ratio gaps. Typical HDP deposition processes employ chemical vapor deposition (CVD) with a gas mixture containing oxygen, silane, and etchant gas to achieve simultaneous dielectric etching and deposition. In an HDP process, an RF bias is applied to a wafer substrate in a reaction chamber. Some of the gas molecules in this gas mixture are ionized in the plasma and accelerate toward the wafer surface when the RF bias is applied to the substrate. Material is thereby sputtered when the ions strike the surface. As a result, dielectric material deposited on the wafer surface is simultaneously sputter-etched to help keep gaps open during the deposition process, which allows higher gap aspect ratios to be filled.

HDP deposition using a fluorine-doped silicon oxide contributes an etching effect during deposition of the insulating film. The simultaneous deposition/etching effect allows FSG films to have improved gap-filling capabilities such that the films are able to adequately fill gaps having high aspect ratios.

Thus, for the foregoing reasons, it is desirable to include fluorine in various dielectric layers and particularly in IMD layers. However, the fluorine in FSG films can damage the active circuitry during the HDP deposition process, due mainly to the fluorine recombining with hydrogen to etch underlying circuitry.

Accordingly, a low dielectric constant insulating film is desired that is capable of filling high aspect ratio gaps without the problems associated with fluorine-doped films discussed above.

SUMMARY

In accordance with the present invention, a low dielectric constant gap-fill process uses high density plasma (HDP) deposition processes with boron-doped, instead of fluorine-doped, silicon oxide to reduce the damaging effects of fluorine while still maintaining a low dielectric constant for an intermetal dielectric (IMD) layer.

In one embodiment, a gaseous mixture of silane, oxygen, and diborane is used for a chemical vapor deposition (CVD) HDP process for simultaneous and etching of an IMD layer, where the IMD layer is capable of high aspect gap fill. With the weight concentration of boron between 1% and 10%, the dielectric constant of the IMD film is reduced without damaging underlying circuit elements.

The present invention will be better understood in light of the following detailed description, taken together with the accompanying drawings.

BRIEF DESCRIPTION OF THE DRAWINGS

Use of the same reference numbers in different figures indicates similar or like elements.

DETAILED DESCRIPTION

In accordance with an embodiment of the present invention, a process for depositing intermetal dielectric (IMD) layers uses high density plasma (HDP) deposition for depositing boron-doped silicate glass (BSG), resulting in low dielectric constant (k) films capable of high aspect ratio gap fills without damage to the underlying elements, which is a possibility with conventional fluorine-doped silicate glass (FSG).

Figure 1:
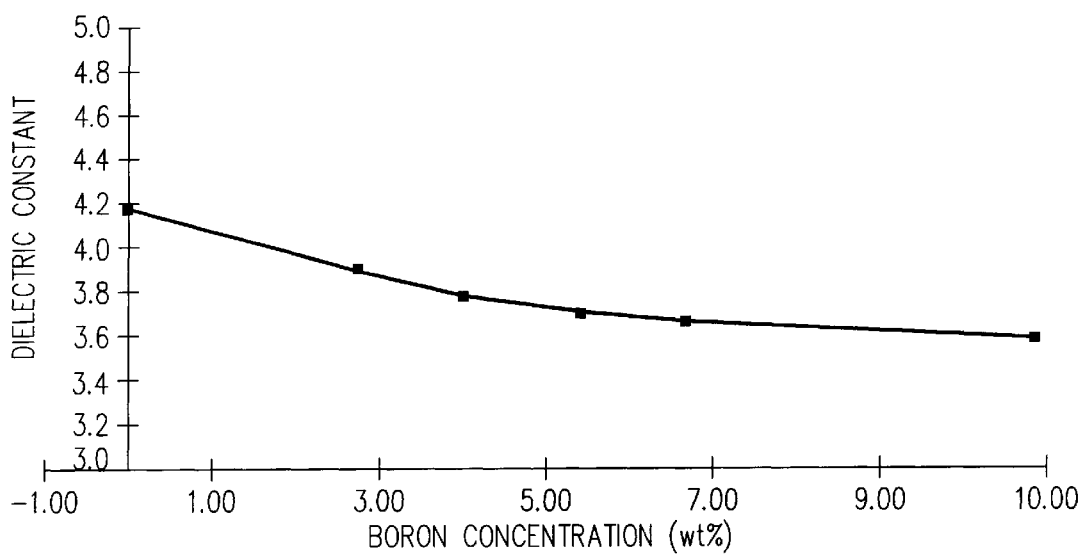
FIG. 1 is a graph of the dielectric constant of a silicon oxide layer as a function of boron concentration.

Similar to conventional HDP IMD deposition processes, a gas mixture is used containing silane ($SiH_4$) and oxygen ($O_2$). However, contrary to conventional HDP IMD processes, boron (B) rather than fluorine (F) is used to dope the silicon oxide ($SiO_2$) layer. Boron, like fluorine, reduces the dielectric constant of the $SiO_2$ layer to around 3.5. However, the incorporation of boron, unlike fluorine, does not damage underlying circuitry because only a weak boric acid is formed. The dielectric constant of the BSG film is dependent on the amount of boron present in the film. Experimental results have shown that the dielectric constant drops from about 4.1 to about 3.5 by increasing the boron concentration from about 1 wt % to about 10 wt %, as shown in FIG. 1. Higher concentrations of boron result in stronger boric acids, which can damage the active circuitry, similar to fluorine.

Diborane ($B_2H_6$) is used to introduce the boron into the film. A mixture of $SiH_4$, $O_2$, and $B_2H_6$ is used to simultaneously deposit and etch dielectric material, where $SiH_4$ and $O_2$ are used to form $SiO_2$ for the deposition component, and $O_2$ is used for the sputtering component. Table 1 below lists the three gases for deposition of a BSG film and their respective gas flow ranges, with the actual gas flow amount dependent upon the application and wafer size.

TABLE 1

| Gas | Flow Rate (sccm) |
| --- | --- |
| $SiH_4$ | 80–120 |
| $O_2$ | 100–800 |
| $B_2H_6$ | 0–400 |

Note that in addition to gaseous sources, boron can be introduced into the film through liquid or solid sources as well, which are well known in the art.

Table 2 below lists various process parameters and ranges for an IMD deposition step.

TABLE 2

| Parameter | Range |
| --- | --- |
| Pressure (mTorr) | 0.5–8 |
| Temperature (° C.) | 300–450 |
| LF Power (kW) | 2–4 |
| HF Power (kW) | 0.5–3 |

Low frequency (LF) and high frequency (HF) power requirements depend upon the wafer size (e.g., 200 or 300 mm diameter) and the process being used.

Figure 2A:
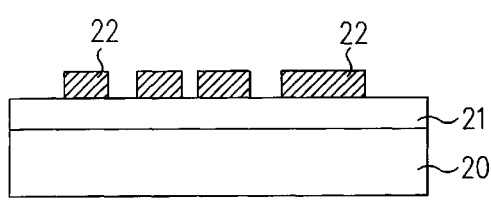
FIGS. 2A–2C are cross sectional views of steps for depositing a low-k IMD layer according to the present invention.
Figure 2B:
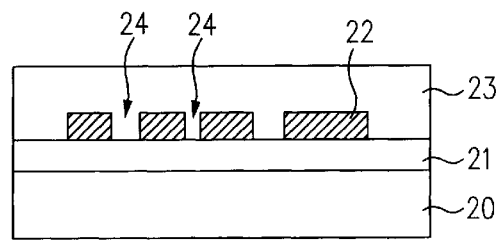
Figure 2C:
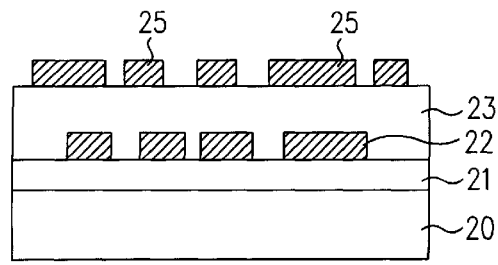

By replacing fluorine with boron for the deposition of IMD layers, the likelihood of damaging underlying circuit elements during the deposition process is reduced, while still maintaining low dielectric constants and high aspect ratio gap fill capabilities. FIGS. 2A–2C illustrate the steps of low-k IMD deposition using BSG according to the present invention.

FIG. 2A shows a substrate 20 on which is deposited an insulating or dielectric layer 21, such as a silicon oxide $SiO_2$. Dielectric layer 21 serves as the polysilicon-metal interlevel dielectric (PMD) to insulate circuit elements on substrate 20 from a first overlying conducting or metal layer 22. Dielectric layer 21 also has contact openings formed therein (not shown) to electrically connect circuit elements in and on substrate 20 to first metal layer 22. First metal layer 22 can be patterned by conventional photoresist masking and etching to form the desired metal interconnections to the underlying circuit elements.

In FIG. 2B, a BSG layer 23, as described above, is then deposited over the patterned metal layer 22 and the gaps formed therebetween using HDP deposition. The concentration of boron in BSG layer 23 ranges from 1 wt % to 10 wt %, depending on the dielectric constant desired. By doping the dielectric with boron instead of fluorine, circuit damage caused by fluorine is eliminated. Furthermore, high aspect ratio gaps 24 in the patterned metal layer 22 can be filled without voids or irregularities with the BSG layer 23. The BSG layer 23 with a low dielectric constant is then used to effectively insulate patterned metal 22 from an intervening layer, such as a subsequent patterned metal layer 25. It should be noted that BSG layer 23 does not have to be deposited directly on patterned metal layer 22, but can be deposited on intervening layers, such as on an insulating layer on top of a barrier layer on metal layer 22.

While particular embodiments of the present invention have been shown and described, it will be obvious to those skilled in the art that changes and modifications may be made without departing from this invention in its broader aspects. For example, even though the above description involves deposition of an IMD layer, other layers in which a low dielectric constant with high aspect ratio gap fill capabilities are desired can also be used with the concepts of the present invention. Therefore, the appended claims are to encompass within their scope all such changes and modifications as fall within the true spirit and scope of this invention.

I claim:

1. A process for filling gaps during integrated circuit production, comprising:

providing a gas mixture consisting of silicon-containing, oxygen-containing, and boron-containing components; and depositing a film over said gaps by using said gas mixture for simultaneous chemical vapor deposition (CVD) and sputter etching.

2. The process of claim 1, wherein said film is an intermetal dielectric (IMD) layer.

3. The process of claim 1, wherein said film is deposited on wafers between 200 and 300 mm in diameter.

4. The process of claim 1, wherein said silicon-containing component is silane.

5. The process of claim 4, wherein said silane is at a flow rate of 80 to 120 sccm.

6. The process of claim 1, wherein said oxygen-containing component is $O_2$.

7. The process of claim 6, wherein said $O_2$ is at a flow rate of 100 to 800 sccm.

8. The process of claim 1, wherein said boron-containing component is diborane ($B_2H_6$).

9. The process of claim 8, wherein said diborane is at a flow rate of 400 sccm or less.

10. The process of claim 1, wherein the boron weight concentration in said film is between 1% and 10%.

11. A process for filling gaps during integrated circuit production, comprising:

depositing a film over said gaps by high density plasma (HDP) deposition using a gas mixture consisting of silicon-containing, oxygen-containing, and boron-containing components.

12. The process of claim 11, wherein said film is an intermetal dielectric (IMD) layer.

13. The process of claim 11, wherein the boron weight concentration in said film is between 1% and 10%.

* * * * *